United States Patent [19]

Parrillo et al.

[11] 4,435,896
[45] Mar. 13, 1984

[54] METHOD FOR FABRICATING COMPLEMENTARY FIELD EFFECT TRANSISTOR DEVICES

[75] Inventors: Louis C. Parrillo, Warren, N.J.; Richard S. Payne, Andover, Mass.

[73] Assignee: Bell Telephone Laboratories, Incorporated, Murray Hill, N.J.

[21] Appl. No.: 508,923

[22] Filed: Jun. 29, 1983

Related U.S. Application Data

[63] Continuation-in-part of Ser. No. 328,150, Dec. 7, 1981, abandoned.

[51] Int. Cl.³ .......................................... H01L 21/265
[52] U.S. Cl. .................................. 29/571; 29/576 B; 29/578; 148/187; 357/42
[58] Field of Search .................... 29/571, 576 B, 578; 148/1.5, 187; 357/42

[56] References Cited

U.S. PATENT DOCUMENTS

| | | | |
|---|---|---|---|
| 3,759,763 | 9/1973 | Wang | 148/187 X |
| 3,821,781 | 6/1974 | Chang et al. | 357/44 |
| 3,868,274 | 2/1975 | Hubar et al. | 148/187 X |
| 4,013,484 | 3/1977 | Boleky et al. | 148/175 X |
| 4,268,321 | 5/1981 | Meguro | 148/1.5 |
| 4,277,291 | 7/1981 | Cerofolini et al. | 148/187 X |
| 4,280,272 | 7/1981 | Egawa et al. | 29/571 |
| 4,295,266 | 10/1981 | Hsu | 29/571 |
| 4,313,768 | 2/1982 | Sanders et al. | 29/571 X |
| 4,342,149 | 8/1982 | Jacobs et al. | 29/571 X |

OTHER PUBLICATIONS

Proceedings of the 10th Conference on Solid State Devices, Tokyo, 1978; Japanese Journal of Applied Physics, vol. 18 (1979) Supplement 18-1, pp. 73-78; "High Packing Density, High Speed CMOS (Hi-CMOS) Device Technology," Y. Sakai, T. Masuhara, O. Minato, and N. Hashimoto.

1981 IEEE International Solid-State Circuits Conference; pp. 14 and 15; "H-i-CMOSII 4K Static RAM," O. Minato, T. Masuhara, T. Sasaki, Y. Sakai and K. Yoshizaki.

*Primary Examiner*—G. Ozaki
*Attorney, Agent, or Firm*—Arthur J. Torsiglieri

[57] ABSTRACT

Disclosed is an eight-mask twin-tub CMOS process which forms contiguous p- and n-tubs in a relatively lightly doped bulk region in a self-aligned manner using a single masking step. The process also forms the sources and drains of the p- and n-channel transistors with a single masking step by first nonselectively implanting p-type impurities into all source and drain regions and then selectively implanting n-type impurities into only the source and drain regions of the n-channel transistors in amounts sufficient to overcompensate the p-type impurities therein.

14 Claims, 9 Drawing Figures

METHOD FOR FABRICATING COMPLEMENTARY FIELD EFFECT TRANSISTOR DEVICES

CROSS-REFERENCE TO RELATED APPLICATION

This application is a continuation-in-part of my application, Ser. No. 328,150, filed Dec. 7, 1981, now abandoned.

TECHNICAL FIELD

This invention relates to semiconductor devices and, more particularly, to complementary insulated-gate field effect transistor (IGFET) devices in which both p- and n-channel conductivity type transistors are integrated on a single chip which comprises both surface p-type and n-type tubs, wherein such transistors are respectively located, and to methods for fabricating such devices.

Complementary IGFET devices are well known in the art for having the advantage of much lower power dissipation than equivalent single channel conductivity type devices. Therefore, such devices are particularly suited for very-large-scale-integration (VLSI) random logic circuit applications, such as microprocessors, where the maximum number of gates that can be integrated on a single chip and the maximum operating speed of the circuit are largely determined by the maximum permissible power dissipation for the chip.

Complementary IGFET integrated devices are most commonly manufactured with complementary metal-oxide-semiconductor (CMOS) technology. In a conventional CMOS process the n-channel transistors are formed on the surface of a p-type tub region, hereafter referred to as the p-tub, formed in a moderately doped n-type substrate. The p-channel transistors are formed directly on the surface of the n-type substrate. In order to obtain close control over the threshold voltage of the n-channel transistors, the impurity concentration of the p-tub is normally made approximately an order of magnitude greater than that of the n-type substrate. Recent advances in semiconductor technology in areas such as photolithography, ion-implantation and plasma etching have made feasible the fabrication of transistors having shorter channel lengths than previously obtainable. Although the use of shorter channel length transistors provides the benefits of a higher scale of integration and improved performance, such use also requires that the impurity concentration of the substrate be raised to allow the p-channel transistors to withstand normal power supply voltages without exhibiting excessive leakage currents. Owing to the dependence of the impurity concentration of the p-tub on that of the substrate in a conventional single-tub CMOS structure, raising the substrate impurity concentration necessitates a proportionate rise in the p-tub impurity concentration, which causes an undesirable rise in the source/drain junction capacitances of the n-channel transistors. Therefore, a problem with conventional single-tub CMOS technology is that scaling of the impurity concentrations to permit the use of shorter channel transistors generally gives rise to excessive source/drain junction capacitances of the n-channel transistors.

A known solution to the scaling problem in conventional CMOS technology is to employ a separate n-type tub region, hereafter referred to as the n-tub, for the formation of the p-channel transistors. A CMOS technology which forms separate p- and n-tubs, hereafter referred to as twin-tub CMOS technology, allows the impurity concentration in each tube to be optimized independently of the other and provides n-channel transistors with lower source/drain junction capacitances than those provided by conventional CMOS technology. However, prior art twin-tub CMOS processes require an additional masking step for the formation of the n-tub and have utilized spaced apart p- and n-tubs for alignment purposes. Consequently, prior art twin-tub CMOS processes have the disadvantage of being more costly and requiring a larger chip area for a given circuit than conventional CMOS processes.

Therefore, a need exists for a twin-tub CMOS process requiring fewer masking steps and permitting more efficient use of chip area than the prior art.

SUMMARY OF THE INVENTION

The disadvantages of the prior art discussed above are substantially removed by the present invention. In one aspect, the invention is a twin-tub complementary CMOS integrated circuit in which the n-tubs and p-tubs are contiguous with one another with no spacing between. In another aspect, the invention is a method for manufacturing a complementary IGFET device in which p- and n-tubs are formed in a semiconductive bulk region in a self-aligned manner using a single masking step. Additionally, in a preferred embodiment the source/drain regions for both the p- and n-channel transistors are also formed using a single masking step.

In an exemplary embodiment of the invention, a relatively thin oxide layer is first formed on a surface of a silicon body. A nitride layer is then formed over the oxide layer. Using a first masking step, the oxide and nitride layers are selectively removed exposing a first portion of the surface. The n-tub is then implanted into the first portion of the surface. The first portion of the surface is then oxidized to form a relatively thick oxide layer. The remaining nitride layer is then removed and the p-tub is implanted through the remaining relatively thin oxide layer self-aligned to the n-tub, which is screened by the relatively thick oxide layer. In an alternative embodiment, the p-tub is formed first, and the n-tub subsequently.

After defining transistor areas in the silicon surface and forming thin oxide and polysilicon gate layers in the transistor areas and a relatively thicker field oxide layer outside of the transistor areas, boron ions are implanted into the source/drain regions of both the p- and n-channel transistors at a dose sufficient for forming the sources and drains of the p-channel transistors. An appropriate photoresist layer is then selectively formed, using another masking step, to cover only the p-channel transistor areas. While the source/drain regions of p-channel transistors are screened by the photoresist layer, phosphorus ions are implanted into the source/drain regions of the n-channel transistors at a dose sufficient to overcompensate the boron therein and to provide sufficient net n-type impurities for forming the sources and drains of the n-channel transistors. In an alternative embodiment, the selective donor implantation is done first, and the nonselective acceptor implantation follows.

Thus, the practice of the present invention permits the fabrication of a twin-tub complementary IGFET device using only eight critical masking steps, in contrast with ten critical masking steps required by prior art twin-tub CMOS processes and nine critical masking steps normally required by conventional single-tub CMOS processes. Moreover, it permits the fabrication of twin tubs which are contiguous with one another with essentially no unmodified starting material in between.

DETAILED DESCRIPTION

In FIGS. 1 to 8 there are shown cross-sectional views of a portion of a twin-tub complementary IGFET device fabricated according to the preferred embodiment of the present invention. The device may, for example, be a VLSI circuit in which case there would be a large number of tubs of each type, each of which might contain one or more transistors. Like reference numerals are used throughout the Figures to denote like parts or regions of the device.

Figure 1:
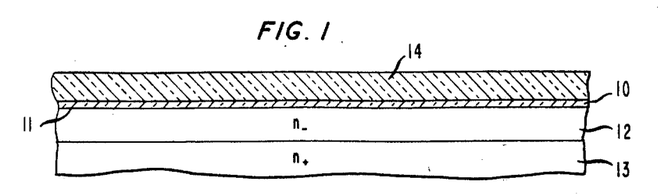
FIGS. 1 to 8 are cross-sectional views of a portion of a twin-tub complementary IGFET device fabricated according to the preferred embodiment of the present invention.

Referring now to FIG. 1, silicon dioxide layer 10, approximately 350 Angstroms thick, is thermally grown on a surface 11 of a silicon body 12, which in this example is a 10-20 μm thick, 10-50 Ω-cm, n-type (As doped) epitaxial layer grown on a 0.008-0.03 Ω-cm, n-type (Sb doped), <100> monocrystalline silicon substrate 13. Typically, the substrate would be a relatively large wafer which would be cut up after processing into a number of chips, each of which would include a VLSI circuit employing a large number of p-channel and n-channel transistors. The use of a relatively lightly doped (n−) epitaxial layer on a relatively doped (n+) substrate provides protection against SCR latch-up in the device. A silicon nitride layer 14, approximately 1200 Angstroms thick, is formed on the silicon dioxide layer by low pressure chemical vapor deposition (LPCVD).

Figure 2:
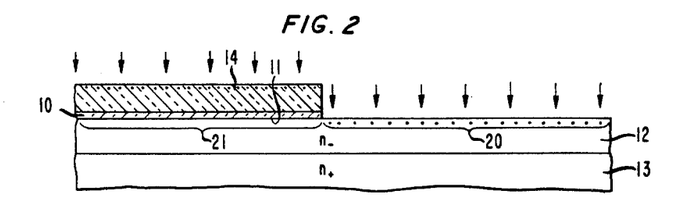

Turning now to FIG. 2, the silicon nitride layer 14 and the silicon dioxide layer 10 are both selectively removed, using conventional photolithographic and etching techniques (first masking step), from a first portion 20 of the surface 11. While a second portion 21 of the surface is screened by the remainder of the silicon nitride layer 14, the first portion of the surface is implanted with phosphorus ions (P+) at a dose sufficient to provide n-type impurities for forming the n-tub, as is described in step 15 below.

Figure 3:
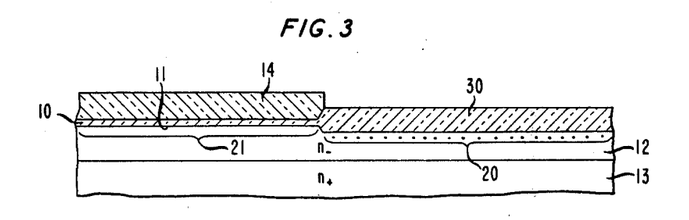

Referring now to FIG. 3, after the n-tub implant, the first portion 20 of the surface is cleaned and a layer of silicon dioxide 30, approximately 4000 Angstroms thick, is thermally grown thereon. The second portion of the silicon surface 21 is screened from the oxidation by the remainder of the silicon nitride layer 14.

Figure 4:
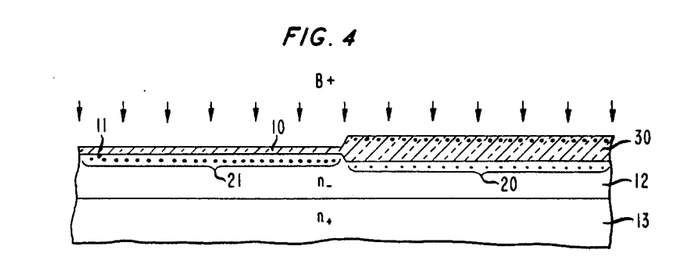

Turning now to FIG. 4, the remainder of the silicon nitride layer is removed by an etchant (H$_3$PO$_4$) which does not attack the silicon dioxide layers 10 and 30. The second portion of the silicon surface 21 is then implanted with boron ions (B+) through the relatively thin silicon dioxide layer 10 at a dose sufficient to provide p-type impurities for forming the p-tub, as is described in step 20 below. The first portion of the surface 20 is screened from the boron implant by the relatively thick silicon dioxide layer 30. Thus, the p-tub is implanted in a self-aligned manner to the oxide screened n-tub, and both tubs are formed with a single masking step. Since no spacing is required between the contiguous p- and n-tubs, a more efficient usage of chip area is obtained. It should be evident that the order of the introduction of the two impurities can be reversed if desired.

Figure 5:
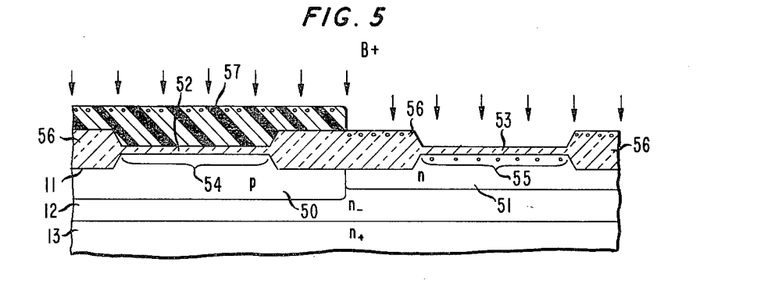

Referring now to FIG. 5, after the p-tub implant, the oxide layers 10 and 30 (shown in FIG. 4) are both removed. Both tubs 50 and 51 are then driven to a depth of 5-6 μm in a thermal diffusion step, as is described in step 23 below. Using a known selective oxidation technique and conventional photolithographic and etching techniques (second masking step), silicon dioxide layers 52 and 53, both approximately 600 Angstroms thick, are thermally grown in preselected transistor areas 54 and 55 in the silicon surface over the p-tub and the n-tub, respectively, and a silicon dioxide layer 56, approximately 15,000 Angstroms thick, is thermally grown over the other areas of the surface outside of the transistor areas. As will become apparent upon completion of the device, portions of layers 52 and 53 serve as the gate insulator (gate oxide) of the p- and n-channel transistors, respectively, while layer 56 serves as field insulator (field oxide) of the device. In some instances, it may be desirable to remove the initially grown layers 52 and 53 and to grow fresh layers for use as the gate oxide later in the processing. A variety of techniques are available to achieve these ends and an illustrative technique is described hereinafter in steps 26 through 34, which describe the well-known localized oxidation technique. Basically, these steps involve covering the surface with silicon nitride, and then patterning the silicon nitride by photolithography to leave covered the regions 54 and 55 which are to serve as the active transistor region. As known in the art, this advantageously is done by first oxidizing the surface of the nitride, then patterning this surface oxide by photolithography and then etching away the nitride where this surface oxide has been removed. After the silicon nitride has been removed from the area between regions 54 and 55, the device is oxidized to form the thick oxide region 56. After formation of the thick oxide, the nitride remaining over the regions 54 and 55 is removed, and the thin oxide layer 52,53 grown. These steps form steps 26 through 34 of the detailed process set forth below.

Figure 9:
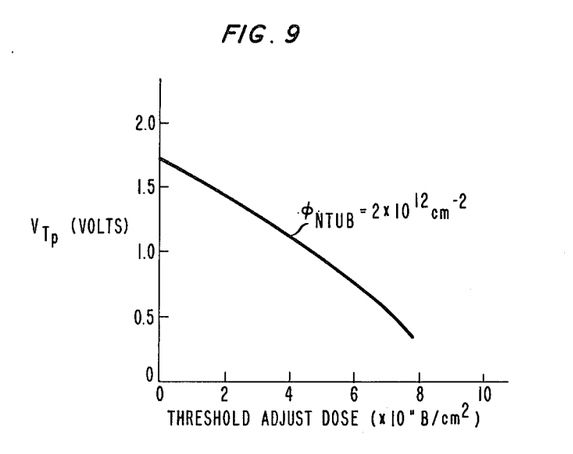
FIG. 9 is a graph illustrating the dependence of the p-channel transistor threshold voltage, $V_{TP}$, on the threshold adjust implant dose for an n-tub implant dose, $\phi_{NTUB}$, of $2 \times 10^{12}$ cm$^{-2}$.

At this point in the fabrication process, both tubs have approximately the same surface impurity concentration of approximately $1 \times 10^{-16}$ cm$^{-3}$. Since the oxide layer 52,53 is 600 Angstroms thick and n-type polysilicon is to be used as the gate conductor, the unadjusted threshold voltages will be approximately 0.6 V for the n-channel transistor and −1.7 V for the p-channel transistor. It is usually desirable from the standpoint of device performance for the p- and n-channel transistors to have threshold voltages of equal magnitude. Therefore, the theshold voltage of the p-channel transistor is raised to the desired level of approximately −0.6 V by selectively implanting boron ions into the p-channel transistor area 55. Using conventional photolithographic techniques (third masking step), a layer of an appropriate photoresist 57 is formed to cover only the n-channel transistor area 54. While the n-channel transistor area is screened by the photoresist layer, boron ions are implanted through the silicon dioxide layer 53 into the p-channel transistor area 55 at a dose sufficient to raise the p-channel transistor threshold voltage to the desired level, as is described in step 38 below. The dependence of the p-channel transistor threshold voltage on the threshold adjust implant dose is illustrated in FIG. 9.

Figure 6:
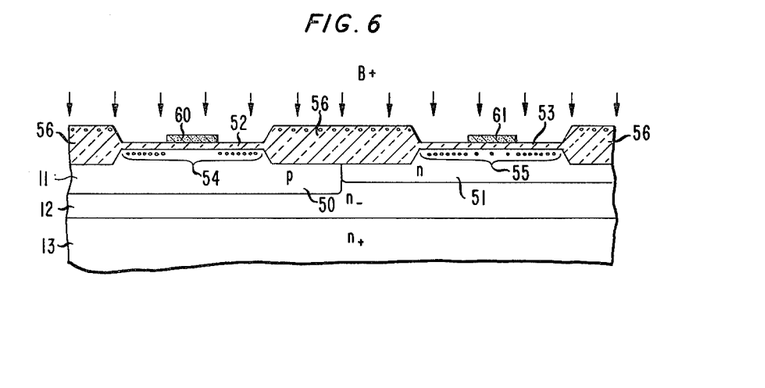

Turning now to FIG. 6, after the threshold adjustment implant, the photoresist layer 57 is removed. A layer of undoped polysilicon, approximately 6500 Angstroms thick, is deposited over the device and it is subsequently doped with phosphorus. As described in step 43 of the detailed specification, this subsequent doping is by way of a vapor diffusion step which heavily saturates the polysilicon with phosphorus so that the various subsequent ion implantations of the polysilicon has relatively little effect on its conductivity. The polysilicon layer is then patterned with conventional photolithographic and etching techniques (fourth masking step) to form conductor strips 60 and 61 overlying the silicon dioxide layers 52 and 53 and covering a central portion of transistor areas 54 and 55, respectively. While the silicon surface 11 is screened by the relatively thick silicon dioxide layer 56 and the polysilicon layers 60 and 61, boron ions are implanted through the relatively thin silicon dioxide layers 52 and 53 into the uncovered portions of both the p- and the n-channel transistor areas at a dose sufficient for providing p-type impurities for forming the source/drain regions of the p-channel transistor, as is described in step 53 below.

Figure 7:
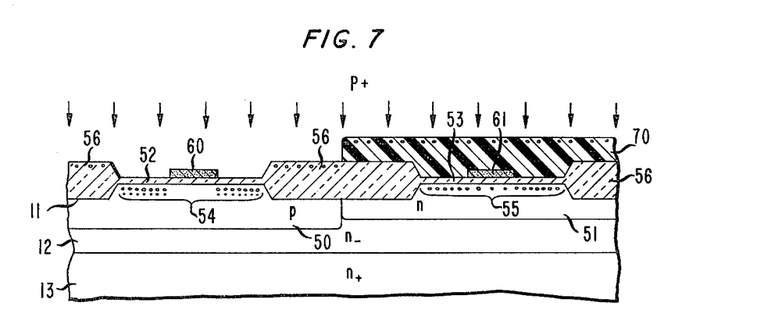

Referring now to FIG. 7, after the boron implant, a layer of an appropriate photoresist 70 is formed and patterned with conventional photolithography (fifth masking step) to cover only the p-channel transistor area 55. While the p-channel transistor area is screened by the photoresist layer, the uncovered portions of the n-channel transistor layer receive a phosphorus implant at a dose sufficient to overcompensate the boron previously implanted therein and to provide net n-type impurities for forming the source/drain regions of the n-channel transistor, as is described in step 55 below. Thus, the impurities for forming the source/drain regions of both the p- and n-channel transistors are provided with only a single masking step. The impurities remain near the surface until driven by a subsequent thermal diffusion step. It is generally advantageous to implant the impurities for the source/drain regions through the gate oxide layers in order to avoid possible contamination of the gate edges.

Alternatively, it is feasible to do the selective implantation of phosphorus ions first and the nonselective implantation of boron ions subsequently. In this case, after formation of the gate conductors, as shown in FIG. 6, the photoresist layer 70 would be deposited and patterned as seen in FIG. 7 for the implantation of the phosphorus selectively in the n-type regions not covered by the photoresist or the gate conductor. As such implantation, the photoresist 70 would be removed, and then there would follow the implantation of boron, as seen in FIG. 6, nonselectively into both n-type and p-type regions not covered by the gate conductors. However, even in this alternative, the impurities for forming the source/drain regions of both the p- and n-channel transistors are provided with only a single masking step.

Figure 8:
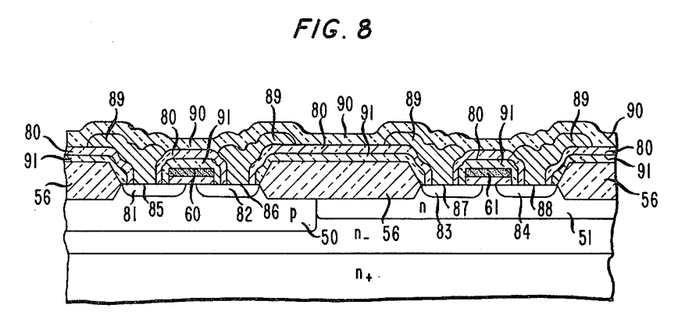

Turning now to FIG. 8, a layer of undoped glass 91 and a layer of phosphorus doped glass 80 (p-glass) are deposited over the entire device by LPCVD and flowed at a high temperature (1100 degrees C.). During the glass flow, the source/drain regions 81 to 84 of both types of transistors are driven to a depth of 1.0–1.2 μm. The glass layers are patterned with photolithography and plasma etching (sixth masking step) to open contact windows 85 to 88 for the source/drain regions 81 to 84, respectively, and contact windows to polysilicon conductors (not shown). The surfaces exposed by the contact windows are cleaned, and the glass surrounding the windows reflowed before an aluminum layer 89 is deposited and patterned with conventional photolithography and plasma etching (seventh masking step). A low temperature hydrogen sinter is used to prevent the aluminum in the contact windows from "spiking" through the shallow source/drain regions. Finally, a layer of silicon nitride 90 is plasma deposited over the entire device and patterned with conventional photolithography and plasma etching (eighth masking step) to open vias (not shown) for bonding external connections to the device.

It will be noted that because the polysilicon gate conductors for both types of transistors are patterned in the same step, and both conductivity type source/drain regions are driven simultaneously to approximately the same depth, any variations in etching or thermal drive will affect both type transistors proportionately. Therefore, such variations will have little effect on the current drive ratios of the two types of transistors.

The active channel length of each type of transistor is nominally 2.0 μm, which allows a maximum supply voltage of 5.5 V. At higher supply voltages, the avalanche current in the n-channel transistor becomes significantly large, and it may become desirable to employ longer channel lengths to avoid excessive leakage currents in the device.

To the first order the threshold voltages of the p- and n-channel transistors are independent of one another. Moreover, each of the gate conductors is n-type as a result of being heavily diffused with phosphorus (step 43). In particular, the surface impurity concentrations of the p- and n-tubs are determined primarily by the separate tub implants and are relatively independent of the impurity concentration of the bulk region in which they are formed, since this is much lower. However, second order effects such as dopant contamination during tub oxidation and drives can affect the surface concentration of the tubs unequally.

Outside the transistor areas, the polysilicon conductors passing over the field oxide layer and the tubs form parasitic transistors with a 13 V threshold voltage for those over the p-tub and a −19 V threshold voltage for those over the n-tub. However, the threshold voltage of a parasitic transistor near the border of the two tubs is of a much smaller magnitude, owing to a significantly lower surface impurity concentration at the border caused by interdiffusion of the p- and n-tubs. Therefore, to avoid excess leakage currents, the transistor areas should be sufficiently removed from a tub edge. For example, in the instant design, it is desirable to maintain at least a 7 μm spacing between the drain of an n-channel transistor and the edge of the p-tub.

In the description of the preferred embodiment given above details of certain techniques and steps, which are conventional and well known to those skilled in the art of semiconductor device processing, have been omitted for purposes of brevity, e.g., the cleaning of the silicon wafers, the annealing of the silicon surface after ion implantation, etching techniques, details of photolithographic patterning and other techniques known to the art.

Moreover, as is known to workers in the art, in some instances it may be desirable to include, in our twin-tub devices to serve as chanstops, regions of increased doping under the field oxide. An advantageous technique for introducing such chanstops in twin-tub integrated CMOS devices of the kind here involved is described in the copending application, having a common assignee of L. C. Parrillo, G. W. Reutlinger, and L. Wang, Ser. No. 365,396, filed Apr. 5, 1982.

The following is a list of processing steps which may be used to practice the present invention:

1. Substrate material: 0.008–0.03 $\Omega$-cm, N(Sb), <100>, 19 mil thick.
2. Epitaxial layer: 10–50 $\Omega$-cm, N(As), 10–20 $\mu$m thick.
3. Clean wafer.
4. Oxidation: 1000 degrees C., $O_2$, HCl, 350 Angstroms.
5. Clean: $H_2SO_4$, $H_2O_2$.
6. Oxide clean: 100:1 HF, 1 min.
7. Nitride deposition: LPCVD, 1200 Angstroms.
8. Oxide clean: 100:1 HF, 2 min.
9. Oxidation of the silicon nitride: 1000 degrees C., steam, 11,000 Angstroms on Si.
10. Photolithography: define n-tub.
11. Oxide etch: 10:1 buffered HF, 2 min.
12. Strip photoresist.
13. Nitride etch: 180 degrees C., $H_3PO_4$, 30 min.
14. Oxide etch: 10:1 buffered HF, 2 min.
15. Implant n-tub: phosphorus, 30 KeV, $2.0 \times 10^{12}$ cm$^{-2}$.
16. Clean: $H_2SO_4$, $H_2O_2$.
17. Oxidation: 1050 degrees C., steam, 4000 Anstroms.
18. Oxide etch: 10:1 buffered HF, 30 sec.
19. Nitride etch: 180 degrees C., $H_3PO_4$, 30 min.
20. Implant p-tub: boron, 30 KeV, $7.0 \times 10^{12}$ cm$^{-2}$.
21. Strip oxide: 10:1 buffered HF, 6 min.
22. Clean: $H_2SO_4$, $H_2O_2$.
23. Tub driven-In: 1200 degrees C., 5 hr., 10% $O_2$, 90% $N_2$, 1100 Angstroms.
24. Oxide etch: 10:1 buffered HF, 2 min.
25. Oxidation: 900 degrees C., $O_2$, HCl, 40 min., 200 Angstroms.
26. Nitride deposition: LPCVD, 1200 Angstroms.
27. Oxidation: 1000 degrees C., steam, 11,000 Angstroms on Si.
28. Photolithography: define active transistor regions.
29. Oxide etch: 10:1 buffered HF, 1 min.
30. Strip photoresist.
31. Nitride etch: 180 degrees C., $H_3PO_4$, 25 min.
32. Oxidation: 1000 degrees C., steam, 15,000 Angstroms.
33. Oxide etch: 10:1 buffered HF, 1 min.
34. Nitride etch: 180 degrees C., $H_3PO_4$, 25 min.
35. Oxide etch: 10:1 buffered HF, 1 min.
36. Oxidation: 1000 degrees C., $O_2$, HCl, 600 Angstroms.
37. Photolithography: define threshold, adjust implant region.
38. Threshold adjust implant: boron, 30 KeV, $7 \times 10^{11}$ cm$^{-2}$.
39. Plasma strip photoresist.
40. Clean: $H_2SO_4$, $H_2O_2$.
41. Oxide clean.
42. Polysilicon deposition: LPCVD, 620 degrees C., 6500 Angstroms.
43. Phosphorus diffusion: 1000 degrees C., PBr$_3$, 30 min.
44. P-Glass removal: 15:1 HF, 4 min.
45. Clean: $H_2SO_4$, $H_2O_2$.
46. Photolithography: define polysilicon pattern.
47. Plasma etch polysilicon: anisotropic etch.
48. Plasma strip photoresist.
49. Photoresist frontside.
50. Plasma etch backside polysilicon.
51. Strip photoresist.
52. Clean: $H_2SO_4$, $H_2O_2$.
53. Implant P-plus: Boron, 30 KeV, $1 \times 10^{15}$ cm$^{-2}$.
54. Photolithography: define region for n-plus implant.
55. Implant N-plus: phosphorus, 100 KeV, $4 \times 10^{15}$ cm$^{-2}$.
56. Plasma strip photoresist.
57. Clean: $H_2SO_4$, $H_2O_2$.
58. Glass deposition: LPCVD undoped layer and P-Glass layer.
59. Glass flow: 1100 degrees C., $N_2$, 20 min.
60. Photoresist frontside.
61. Oxide etch backside: 10:1 buffered HF, 2 min.
62. Strip photoresist.
63. Clean: $H_2SO_4$, $H_2O_2$.
64. Oxide clean: 30:1 buffered HF, 30 sec.
65. Phosphorus getter: 1000 degrees C., PBr$_3$, 45 min.
66. P-Glass removal: 15:1 HF, 4 min.
67. Photolithography: define windows.
68. Plasma etch oxide.
69. Plasma strip photoresist.
70. Clean: $H_2SO_4$, $H_2O_2$.
71. Glass reflow: 1100 degrees C., $N_2$, 5 min.
72. Hydrogen anneal: 500 degrees C., $H_2$, 2 hr.
73. Oxide etch: 30:1 buffered HF, 2 min.
74. Clean: $H_2SO_4$, $H_2O_2$.
75. Oxide clean: 30:1 buffered HF, 1 min.
76. Aluminum deposition: 1 $\mu$m.
77. Photolithography: define aluminum pattern.
78. Plasma etch aluminum.
79. Aluminum sinter: 300 degrees C., $H_2$, 30 min.
80. Nitride deposition: plasma deposition, 1.4 $\mu$m.
81. Photolithography: define nitride windows.
82. Plasma etch nitride.
83. Plasma resist strip.
84. Clean.

While this invention has been described in terms of a particular process for fabricating the integrated complementary IGFET device, it will be understood by those skilled in the art that various changes in the details of the process and the device may be made without departing from the spirit and scope of the invention. For example, other appropriate semiconductive materials may be substituted for silicon. The p- and n-tubs may be formed directly in the substrate of a wafer instead of in an epitaxial layer. The bulk region in which the tubs are formed may be p-type rather than n-type. Other impurities of like conductivity type may be substituted for boron or phosphorus for forming the tubs or the source/drain regions and the source/drain regions may be provided by other deposition techniques instead of ion implantation. Additionally, other materials appropriate for forming the various layers used for screening the implants may be substituted for those used in the preferred embodiment.

What is claimed is:

1. A method for manufacturing a complementary MOS device in a silicon body comprising:
    (1) forming a first screening layer above a surface of the silicon body and selectively removing the first layer from a first portion of the surface leaving a second portion of the surface covered by the remainder of the first layer;

(2) while using the remainder of the first layer to screen the second portion of the surface, providing impurities of a first conductivity type into the first portion of the surface for forming a first tub region;

(3) forming a second screening layer above the first portion of the surface while the second portion of the surface is screened by the remainder of the first layer;

(4) removing the remainder of the first layer;

(5) while using the second layer for screening the first portion of the surface, providing impurities of the second conductivity type into the second portion of the surface for forming a second tub region contiguous to the first tub region;

(6) removing the second layer;

(7) forming gate insulator layers above selected transistor areas in the first and second portions of the surface and a thicker third layer above other areas of the surface outside the transistor areas;

(8) forming gate conductors overlying the gate insulator layers and covering a central portion of each of the transistor areas; and (9) subjecting the surface of donor and acceptor ion implantations, the acceptor implantation being unmasked to permit penetration in both the n-type and p-type tubs, and the donor implantation being masked to permit penetration into only the p-type tub whereby p-type source/drain regions are formed in the n-type tubs and n-type source/drain regions are formed in the p-type regions, each aligned with the gate conductors.

2. The method of claim 1 in which the unmasked acceptor implantation is done before the masked donor implantation.

3. The method of claim 1 in which the unmasked acceptor implantation is done after the masked donor implantation.

4. A method for manufacturing a complementary IGFET device in a semiconductor body comprising:

(1) forming a first screening layer above a surface of the semiconductor body and selectively removing the first layer from a first portion of the surface leaving a second portion of the surface covered by the remainder of the first layer;

(2) while using the remainder of the first layer to screen the second portion of the surface, providing impurities of a first conductivity type into the first portion of the surface for forming a first tub region;

(3) forming a second screening layer above the first portion of the surface while the second portion of the surface is screened by the remainder of the first layer;

(4) removing the remainder of the first layer;

(5) while using the second layer for screening the first portion of the surface, providing impurities of the second conductivity type into the second portion of the surface for forming a second tub region contiguous to the first tub region;

(6) removing the second layer;

(7) forming gate insulator layers above selected transistor areas in the first and second portions of the surface and a third layer above other areas of the surface outside the transistor areas;

(8) forming gate conductors overlying the gate insulator layers and covering a central portion of each of the transistor areas;

(9) while using the third layer and the gate conductors for screening, providing impurities of the second conductivity type into uncovered portions of each transistor area in an amount sufficient for forming source/drain regions of transistors of the second channel conductivity type in the first tub region;

(10) forming a fourth screening layer above the surface and selectively removing the fourth layer from the second portion of the surface; and (11) while using the remainder of the fourth layer for screening the transistor areas in the first portion of the surface, providing impurities of the first conductivity type into the uncovered portions of the transistor areas in the second portion of the surface in amounts sufficient to overcompensate the impurities of the second conductivity type therein and to form the source/drain regions of transistors of the first channel conductivity type in the second tub region.

5. A method as recited in claim 4 wherein after forming the gate insulator layers and the third layer, a fifth screening layer is formed above the surface and selectively removed from the first portion of the surface and while using the fifth layer for screening the transistor areas in the second portion of the surface, impurities of the second conductivity type are provided into the transistor areas in the first portion of the surface in amounts sufficient to adjust the threshold voltage of the transistors of the second channel conductivity type to a desired level.

6. A method as recited in claim 4 wherein prior to forming the first layer, a relatively thin layer is formed on the surface and is selectively removed from the first portion of the surface when the first layer is removed therefrom; the remainder of the relatively thin layer remaining on the second portion of the surface when the remainder of the first layer is removed therefrom; the impurities for forming the first tub region are provided by ion implantation directly into the first portion of the surface; the impurities for forming the second tub region are provided by ion implantation through the relatively thin layer into the second portion of the surface; the impurities for adjusting the threshold voltage of the transistors of the second channel conductivity type are provided by ion implantation through the gate insulator layers into the transistor areas in the first portion of the surface; the impurities for forming the source/drain regions of the transistors of the second channel conductivity type are provided by ion implantation through the gate insulator layers into the uncovered portions of each transistor area; and the impurities for forming the source/drain regions of the transistors of the first channel conductivity type are provided by ion implantation through the gate insulator layers into uncovered portions of the transistor areas in the second portion of the surface.

7. A method as recited in claim 4 wherein the semiconductive body is relatively lightly doped n-type silicon, the first layer is formed by depositing silicon nitride, the relatively thin layer is formed by thermally growing silicon dioxide, the impurities for forming the first tub region are phosphorus ions, the second layer is formed by thermally growing a relatively thick layer of silicon dioxide, the impurities for forming the second tub region are boron ions, the gate insulator layers are formed by growing relatively thin layers of silicon dioxide, the third layer is formed by thermally growing a relatively thick layer of silicon dioxide, the fourth layer is formed by depositing a layer of an appropriate photoresist, the fifth layer is formed by depositing a layer of an appropriate photoresist, the impurities for adjusting the threshold voltage of the p-channel conductivity type transistors are boron ions, the gate conductors are formed by depositing a layer of undoped polysilicon which is subsequently doped with phosphorus impurities and patterned, the impurities for forming the source/drain regions of the p-channel conductivity type transistors are boron ions, and the impurities for forming the source/drain region of the n-channel conductivity type transistors are phosphorus ions.

8. A method for manufacturing a complementary MOS device which is characterized by the method for forming source/drain regions in each of two contiguous tub regions of opposite conductivity type of a silicon body comprising the steps of:

forming a thin oxide layer over the areas of each of the two tub regions where transistors are to be formed and a relatively thicker layer silicon oxide layer over the p-n junction region between the two regions;

depositing a polysilicon layer over the body and patterning it to form gate conductors over the central portion of the two transistor areas; and subjecting the body to donor and acceptor ion implantations, the acceptor implantation being unmasked to permit penetration in both the n-type and p-type tub regions, and the donor implantation being masked to permit penetration into only the p-type tub region whereby p-type source/drain regions are formed in the n-type tub regions and n-type source/drain regions are formed in the p-type tub regions, each aligned with the gate conductors.

9. The method of claim 8 in which the unmasked acceptor implantation is done before the masked donor implantation.

10. The method of claim 8 in which the unmasked acceptor implantation is done after the masked donor implantation.

11. A method for manufacturing a complementary IGFET device comprising:

(1) forming a first screening layer above a surface of a semiconductor body of relatively high resistivity and selectively removing the first layer from a first portion of the surface leaving a second portion of the surface covered by the remainder of the first layer;

(2) while using the remainder of the first layer to screen the second portion of the surface, providing impurities of a first conductivity type into the first portion of the surface for forming a first tub region;

(3) forming a second screening layer above the first portion of the surface while the second portion of the surface is screened by the remainder of the first layer;

(4) removing the remainder of the first layer;

(5) while using the second layer for screening the first portion of the surface, providing impurities of the second conductivity type into the second portion of the surface for forming a second tub region contiguous to the first tub region;

(6) removing the second layer;

(7) forming gate insulator layers above preselected transistor areas in the first and second portions of the surface and forming a field oxide above other areas of the surface outside the transistor areas;

(8) forming gate conductors overlying the gate insulator layers and covering a central portion of each of the transistor areas; and (9) forming source/drain regions aligned with said gate conductors in each of the transistor areas by donor and acceptor ion implantations.

12. A method in accordance with claim 11 in which the acceptor implantation is unmasked to permit penetration into both surface regions while the donor implantation is masked to permit penetration into only the p-type tub region whereby p-type source/drain regions are formed in the n-type tub region and n-type source/drain regions are formed in the p-type tub regions.

13. A method in accordance with claim 12 in which the acceptor implantation is done first.

14. A method in accordance with claim 12 in which the donor implantation is done first.

* * * * *

UNITED STATES PATENT AND TRADEMARK OFFICE
CERTIFICATE OF CORRECTION

PATENT NO. : 4,435,896

DATED : March 13, 1984

INVENTOR(S) : Louis C. Parrillo and Richard S. Payne

It is certified that error appears in the above-identified patent and that said Letters Patent is hereby corrected as shown below:

Column 3, line 39, "n-" should read --$n_-$--, "n+" should read --$n_+$--; line 52, "P+" should read --$P^+$--; line 65, "B+" should read --$B^+$--. Column 5, line 55, "As" should read --After--. Column 6, line 55, "excess" should read --excessive--. Column 11, line 22, before "regions" insert --tub--.

Signed and Sealed this

Thirty-first Day of July 1984

[SEAL]

Attest:

GERALD J. MOSSINGHOFF

Attesting Officer     Commissioner of Patents and Trademarks